United States Patent
Chatterjee et al.

(10) Patent No.: US 7,714,625 B2
(45) Date of Patent: May 11, 2010

(54) SYSTEM AND METHOD FOR FAST RE-LOCKING OF A PHASE LOCKED LOOP CIRCUIT

(75) Inventors: Kallol Chatterjee, Kolkata (IN); Tanmoy Sen, New Delhi (IN)

(73) Assignee: STMicroelectronics Pvt. Ltd., Uttar Pradesh (IN)

( * ) Notice: Subject to any disclaimer, the term of this patent is extended or adjusted under 35 U.S.C. 154(b) by 0 days.

(21) Appl. No.: 12/016,004

(22) Filed: Jan. 17, 2008

(65) Prior Publication Data
US 2008/0290915 A1 Nov. 27, 2008

(30) Foreign Application Priority Data
Jan. 18, 2007 (IN) .......................... 117/DEL/2007

(51) Int. Cl.
*H03L 7/06* (2006.01)
(52) U.S. Cl. ...................................... 327/156; 327/147
(58) Field of Classification Search ......... 327/147–159; 375/375, 376; 331/1, 1 R
See application file for complete search history.

(56) References Cited
U.S. PATENT DOCUMENTS

| 4,559,505 A | 12/1985 | Suarez et al. |
| 4,937,536 A | 6/1990 | Reinhardt et al. |
| 6,661,294 B2 * | 12/2003 | Terashima et al. ............ 331/17 |
| 7,088,172 B1 * | 8/2006 | Lesea et al. .................. 327/543 |
| 2007/0290979 A1 * | 12/2007 | Lee et al. ..................... 345/100 |

* cited by examiner

*Primary Examiner*—Long Nguyen
*Assistant Examiner*—Sibin Chen
(74) *Attorney, Agent, or Firm*—Lisa K. Jorgenson; E. Russell Tarleton; Seed IP Law Group PLLC

(57) ABSTRACT

A system and method for reducing the re-lock time of a phase locked loop (PLL) system, the system including a circuit having a capture control voltage module, a force control voltage module, a loop filter module, and a timer. The capture control voltage module compares the control voltage (voltage input of VCO) with predefined voltage levels during the lock time of the PLL and simultaneously stores the voltage level closest to the control voltage. The stored voltage becomes stable after the PLL has been locked. After power-down is applied and then released, the force control voltage module forces the stored control voltage on the loop filter in a very short time, thereby reducing the re-lock time of the PLL. The loop filter module stabilizes the control voltage. The timer then turns off the force control voltage module by sending a timeout signal after a pre-defined number of clock cycles.

24 Claims, 6 Drawing Sheets

SYSTEM AND METHOD FOR FAST RE-LOCKING OF A PHASE LOCKED LOOP CIRCUIT

BACKGROUND

1. Technical Field

The present disclosure relates to frequency circuits and, more specifically, to a system and method for enhancing re-locking of a phase locked loop (PLL) system, i.e., through this methodology the PLL will be locked almost instantly.

2. Description of the Related Art

In the field of frequency synthesis, phase lock loops (PLLs) are employed to act as wide frequency range tracking filters and as wide frequency range frequency translators. When thus used, the phase lock loop is designed to lock a synthesized signal of a first oscillator at a first frequency and at a first phase to the phase of an incoming reference signal at another frequency. Once the frequency of the synthesized signal developed in the phase lock loop (PLL) is matched to that of the incoming reference signal, steady state is said to exist. However, when the PLL is powered down and then switched on, the phase lock loop experiences a transient state before the loop locks on and settles to the correct reference frequency. For many applications, where the PLL is switched on and off in the same configuration frequently, it is important to reduce the time spent in this transient state.

U.S. Pat. No. 4,937,536 discloses a phase lock loop frequency synthesizer for providing a synthesized frequency signal employing a modified adaptive loop construction having parallel feedback paths about a loop amplifier. A normal feedback path having a narrow bandwidth characteristic includes a feedback capacitor having one end connected to electrical ground via a controlled switch and a second feedback path having a wide bandwidth characteristic with a capacitor also connected across the amplifier. Upon the variation of an incoming reference signal, the controlled switch connects the normal feedback capacitor to ground permitting the wide bandwidth feedback path to rapidly settle the loop while charging the feedback capacitor of the normal feedback path. Upon opening the controlled switch, the narrow bandwidth feedback path completes the charging of the feedback capacitor of the normal feedback loop settling the loop to the steady state condition while enhancing the settling time.

U.S. Pat. No. 4,559,505 discloses a frequency synthesizer is provided including a reference frequency generator coupled to one input of a phase detector. The output of the phase detector is coupled via a pair of alternately connected filters through a voltage controlled oscillator and a divider circuit to the remaining input of the phase detector to form a phase locked loop. The first filter of the pair is designated for operation on a main channel frequency while the remaining filter is designated for operation on a priority channel frequency. The capacitive elements of each respective filter remain fully charged up for operation on their respective frequencies and thus when such filters are alternately switched between to change frequency from the main channel to the priority channel, the capacitive elements need not be charged to new levels to accommodate such frequency change. Thus, switching between a main channel and a priority channel is accomplished in a minimal amount of time with a significant reduction in frequency synthesizer energy requirements.

The patents as described above lack in providing a fast, reliable and efficient mechanism for the fast relocking of the PLL. In the first patent the reduction in lock time is small enough. Whereas the second patent uses multiple loop filters for a fast frequency acquisition, but this methodology causes an increased PLL area.

Therefore, there is a need for a novel methodology that can improve re-locking time of a PLL system by locking the PLL instantaneously.

BRIEF SUMMARY

The embodiments of the present disclosure provide a methodology that can improve re-locking capabilities of a PLL system.

In one embodiment, the present disclosure provides a circuit for reducing a re-lock time of a phase locked loop (PLL) that includes:

a pattern generator helping in serializing data (pre-defined voltage levels) signals;

a capture control voltage module using the serialized data (pre-defined voltage levels) signals for capturing a control voltage when the PLL is in a lock mode;

a force control voltage module operatively coupled to the capture control voltage module for instantaneously passing a voltage from a node corresponding to the control voltage, when the PLL is turned on from a powered off state;

a plurality of serial resistances operatively coupled to the capture control voltage module and the force control voltage module, the plurality of serial resistances connected between a reference voltage and a ground voltage;

a loop filter module operatively coupled to the force control voltage module for stabilizing and storing the control voltage; and a timer module operatively coupled to the force control voltage module for turning off the force control voltage module after a pre-defined number of input cycles.

Further, the present disclosure provides a circuit for reducing a re-lock time of a phase locked loop (PLL), the circuit including:

a capture control voltage module using parallel signals for capturing a control voltage, when the PLL is in a lock mode;

a force control voltage module operatively coupled to the capture control voltage module for instantaneously passing a voltage from a node corresponding to the control voltage, when the PLL is turned on from a powered off state;

a plurality of serial resistances operatively coupled to the capture control voltage module and the force control voltage module, the plurality of serial resistances being between a reference voltage and a ground voltage;

a loop filter module operatively coupled to the force control voltage module for stabilizing and storing the control voltage; and a timer module operatively coupled to the force control voltage module for turning off the force control voltage module after a pre-defined number of input cycles.

Further, the present disclosure provides a method for reducing a relock time of a phase locked loop (PLL), the method including:

providing patterns to a capture control voltage module through a pattern generator;

capturing a control voltage using the capture control voltage module, when the PLL is in a lock state;

forcing the control voltage using a force control voltage module, when the PLL is turned on from a powered down state;

switching off the force control voltage module after receiving a time out signal from a timer; and resuming a phase locking by the PLL.

Further, the present disclosure provides a method for reducing a relock time of a phase locked loop (PLL) that includes:

capturing a control voltage using a capture control voltage module, when the PLL is in a lock state;

forcing the control voltage using a force control voltage module, when the PLL is turned on from a powered down state;

switching off the force control voltage module after receiving a time out signal from a timer; and resuming a phase locking by the PLL.

In accordance with another embodiment, a circuit is provided, the circuit including a voltage control circuit adapted to receive a pattern of input voltages and a control voltage, and to output a stored control voltage; a force control voltage circuit coupled to the voltage control circuit to pass a stored control voltage to the voltage control circuit when the PLL is first powered up; and a plurality of series-coupled resistances coupled between a reference voltage and a ground voltage and further coupled to the voltage control circuit and to the force control voltage circuit to provide variable voltages thereto.

In accordance with another embodiment of the present disclosure, a system for reducing the relock time of a phase lock loop circuit is provided, the system including a capture control voltage circuit adapted to receive a pattern of input voltages and a control voltage, and to output a stored control voltage; a force control voltage module coupled to the voltage control circuit and adapted to receive the stored control voltage and to force the stored control voltage when the PLL is first powered up; a loop filter circuit coupled to the force control voltage circuit for stabilizing and storing the control voltage; and a timer circuit operatively coupled to the force control voltage circuit for turning off the force control voltage circuit after a predetermined number of input voltage cycles have been received.

BRIEF DESCRIPTION OF THE SEVERAL VIEWS OF THE DRAWINGS

The aforementioned aspects and other features of the present disclosure will be explained in the following description, taken in conjunction with the accompanying drawings, wherein.

DETAILED DESCRIPTION

Figure 1:
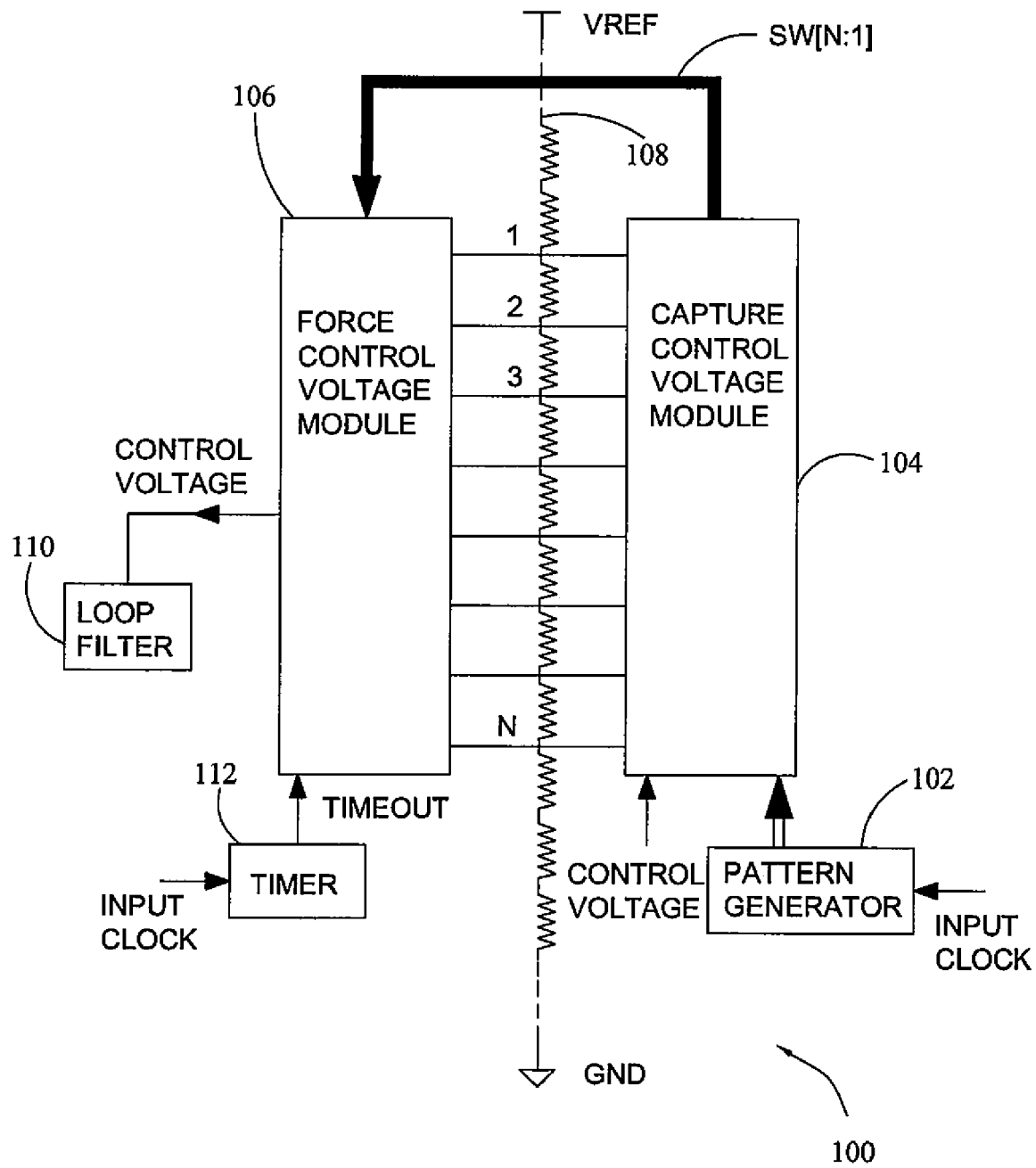
FIG. 1 illustrates a circuit for reducing a re-lock time of a phase locked loop (PLL) according to the present disclosure.

The preferred embodiments of the present disclosure will be described in detail with reference to the accompanying drawings. However, the present disclosure is not limited to the preferred embodiments. The present disclosure can be modified in various forms. The preferred embodiments of the present disclosure are only provided to explain more clearly the present disclosure to one of ordinary skill in the art of the present disclosure. In the accompanying drawings, like reference numerals are used to indicate like components.

This present disclosure reduces the re-lock time of the PLL by cutting down on the time the loop filter capacitor takes to get charged/discharged to the desired control voltage. The term 'relock' is used because the aim of the disclosed circuits and methods is to reduce the lock time of a PLL that has previously gone into a normal lock.

FIG. 1 illustrates a circuit 100 for reducing a re-lock time of a phase locked loop (PLL) according to the present disclosure. The circuit 100 includes a pattern generator 102, a capture control voltage module 104, a force control voltage module 106, a series of resistances 108, a loop filter module 110, and a timer 112. The pattern generator 102 generates clock pulses in a fixed pattern, which helps in serializing the pre-defined voltage levels. In another embodiment, the pattern generator 102 is in a de-active mode (excluded from the circuit) when the pre-defined voltage levels are coming in parallel patterns.

The capture control voltage module 104 uses serialized data (pre-defined voltages) signals for capturing a control voltage when the PLL is in a lock mode. The force control voltage module 106 is operatively coupled to the capture control voltage module 104 for instantaneously passing a voltage from a node corresponding to the control voltage when the PLL is turned on from a powered off state. The series of resistances 1, 2, 3, to N are operatively coupled to the capture control voltage module 104 and the force control voltage module 106 to provide variable voltage nodes, and these resistances are connected between a reference voltage (VREF) and the ground voltage (GND).

The loop filter module 110 is operatively coupled to the force control voltage module 106 for stabilizing and storing the control voltage. In an embodiment of the present disclosure the loop filter module 110 is a low pass filter (LPF) for stabilizing the control voltage. The timer module 112 is operatively coupled to the force control voltage module 106 for turning off the force control voltage module 106 after a pre-defined number of input cycles. The timer module 112 passes a timeout signal to turn off the force control voltage module 106.

Figure 2:
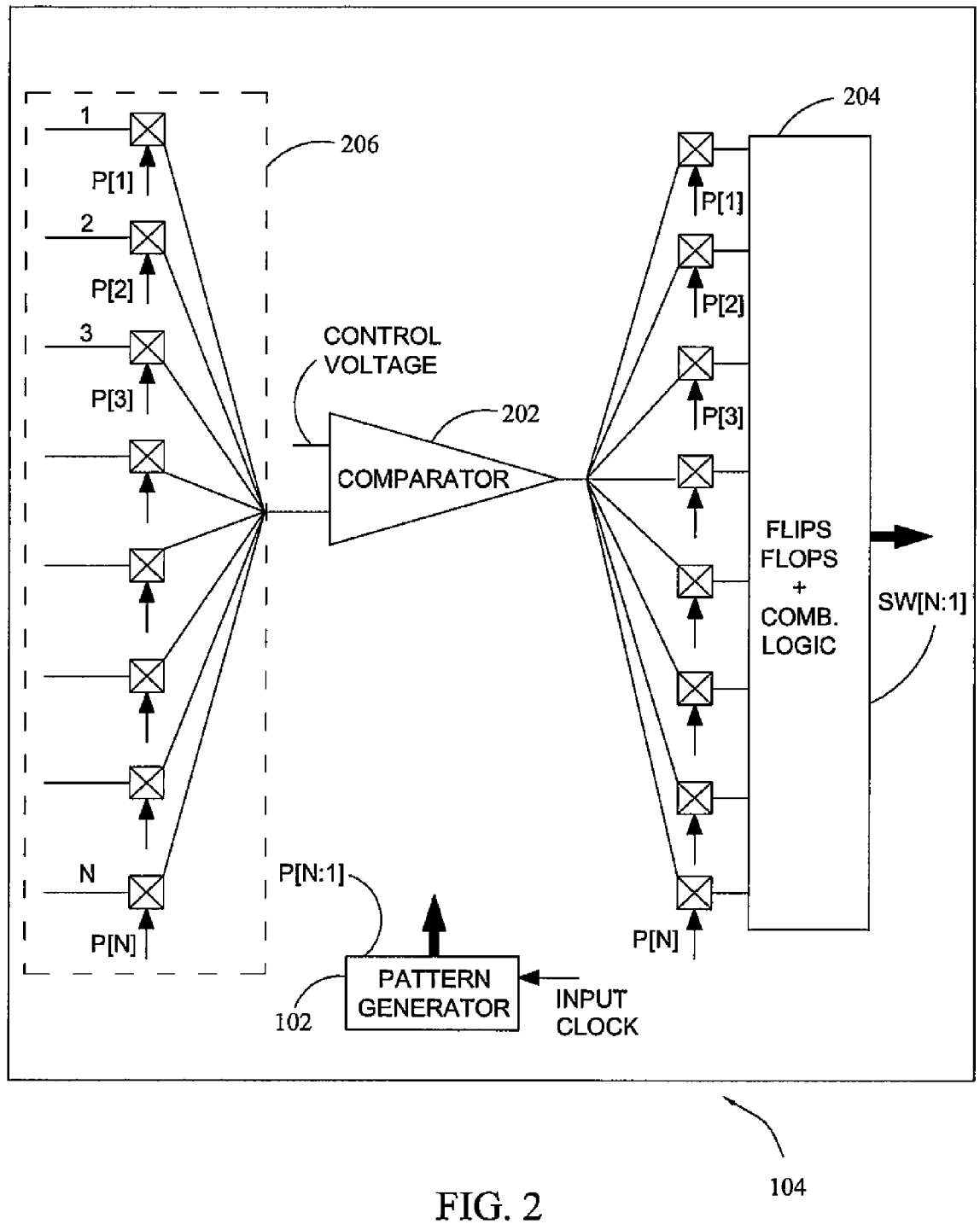
FIG. 2 illustrates a capture control voltage module according to the present disclosure.
Figure 4:
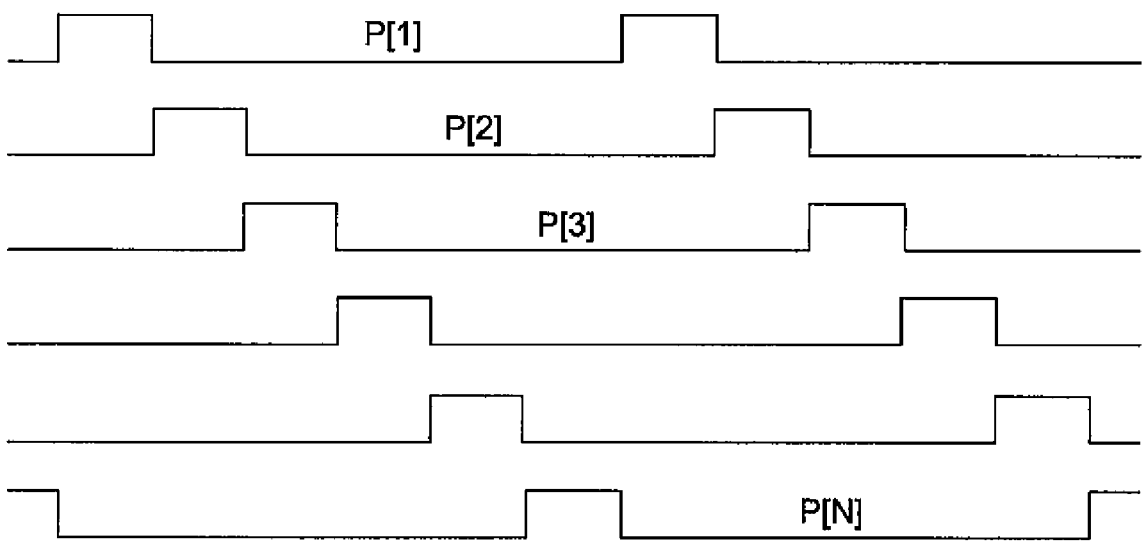
FIG. 4 illustrates a graph describing the patterns generation from a pattern generator according to the present disclosure.

FIG. 2 illustrates the capture control voltage module 104 according to the present disclosure. The capture control voltage module 104 includes a comparator 202, a combinational logic 204, and the sequential logic 204. The capture control voltage module 104 compares the control voltage (voltage on loop filter, voltage input of VCO) with predefined voltage levels during the lock time of the PLL. The predefined voltage levels (lines 1 to N in FIG. 1) are generated using a series of resistances 108 placed in series between the reference voltage (VREF) and the ground voltage (GND). The difference between two consecutive voltage levels is decided by the number of resistances used in series. The comparator 202 compares the control voltage with some voltage on lines 1 to N either serially or in parallel. In serial detection, switches P[1], P[2], . . . P[N] (FIG. 2) are turned on according to the output of the pattern generator 102, P [N:1] (FIG. 4). A sequential block 204 comprising of D flip-flops latches on to the compared data and subsequently, the combinational logic 204 indicates (SW [N:1]) the closest of the N lines to the control voltage. The flip-flops are not powered down along with the PLL so that the stored data is not lost.

Figure 3:
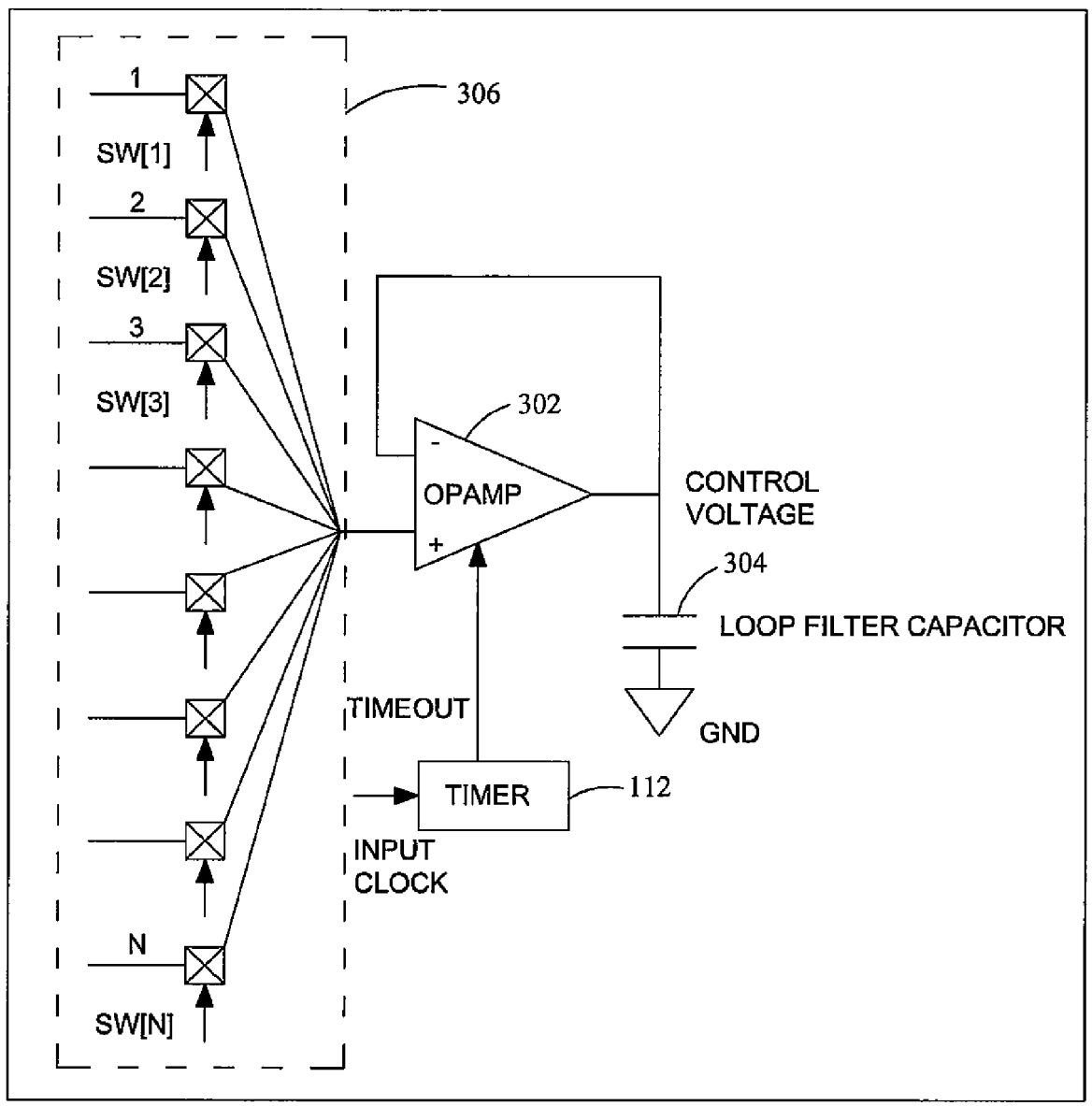
FIG. 3 illustrates a force control voltage module according to the present disclosure.

FIG. 3 illustrates the force control voltage module 106 according to the present disclosure. The module 106 is activated just after the PLL is turned on from a 'power-down' state. The force control voltage module 106 contains N switches shown in block 306 and an operational amplifier 302. The operational amplifier 302 is configured as a voltage follower mode. The operational amplifier 302 is the same as is used in the comparator 202 in the capture control voltage module 104 so that the input offset gets effectively cancelled. One of the switches from the block 306 (FIG. 3) is turned on according to SW [N:1], connecting the appropriate voltage level to the positive input of the operational amplifier 302. The operational amplifier 302, configured as a voltage follower, brings the voltage on the loop filter (control voltage of VCO) capacitor 304 to the voltage on its positive input. Hence, the VCO reaches the desired frequency in a very small time. The timer 112 turns off the operational amplifier 302 after a pre-defined number of input cycles.

The time the system takes to achieve re-lock depends of the following factors,

1. The startup time of the current reference, the current of which is used in the comparator 202 and the operational amplifier 302.

2. The bandwidth of the operational amplifier 302 configured as a voltage follower.

FIG. 4 illustrates a graph describing the pattern generation according to the present disclosure.

Figure 5:
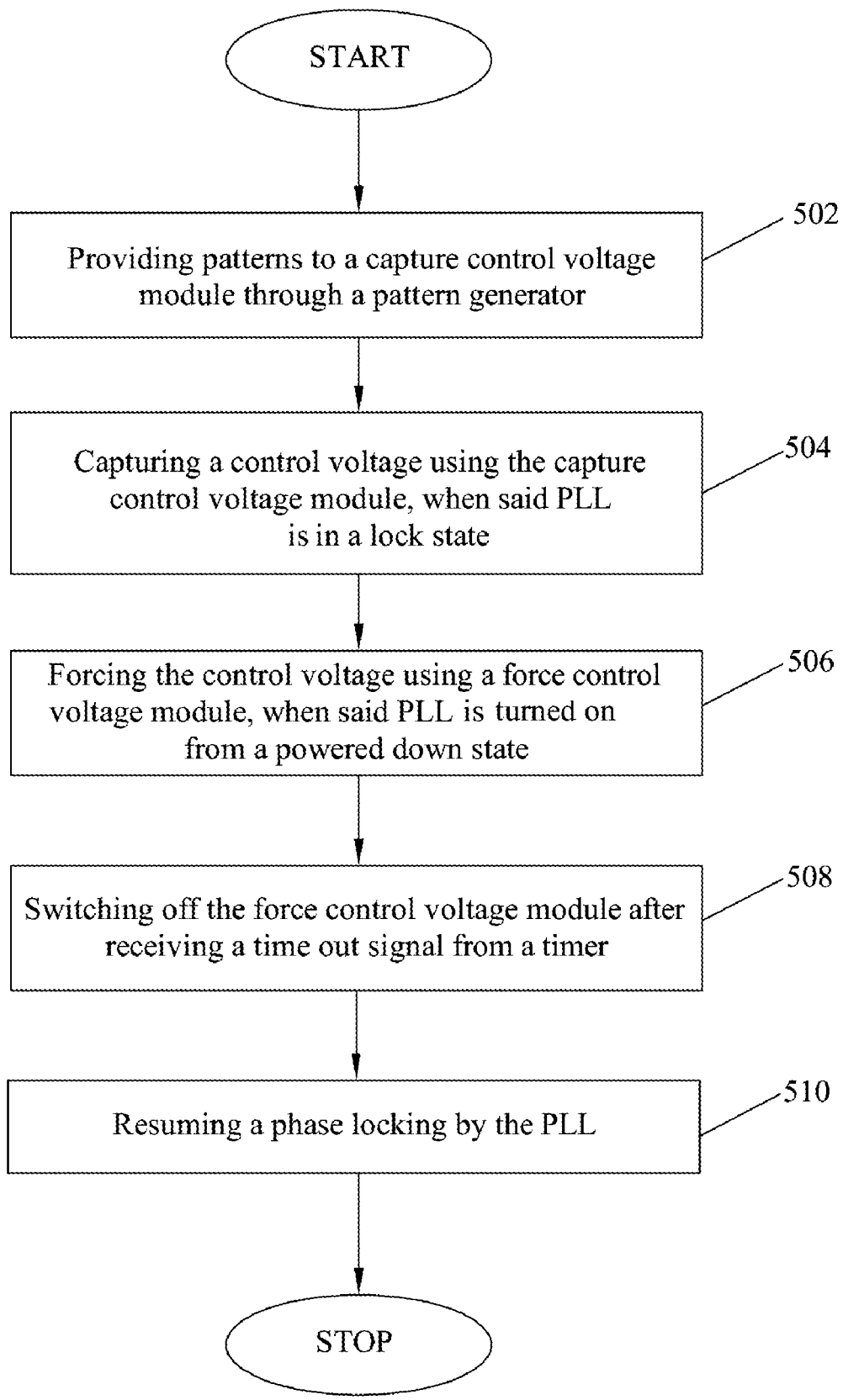
FIG. 5 illustrates a flow diagram of a method for reducing a re-lock time of a phase locked loop (PLL) according to an embodiment of the present disclosure.

FIG. 5 illustrates a flow diagram of a method for reducing a re-lock time of a phase locked loop (PLL) according to an embodiment of the present disclosure. At step 502, patterns are provided to a capture control voltage module through a pattern generator. At step 504, a control voltage is captured using the capture control voltage module when the PLL is in a lock state. At step 506, the control voltage is forced using a force control voltage module when the PLL is turned on from a powered down state. At step 508, the force control voltage module is switched off after receiving a time out signal from a timer. At step 510, a phase locking is resumed by the PLL.

Figure 6:
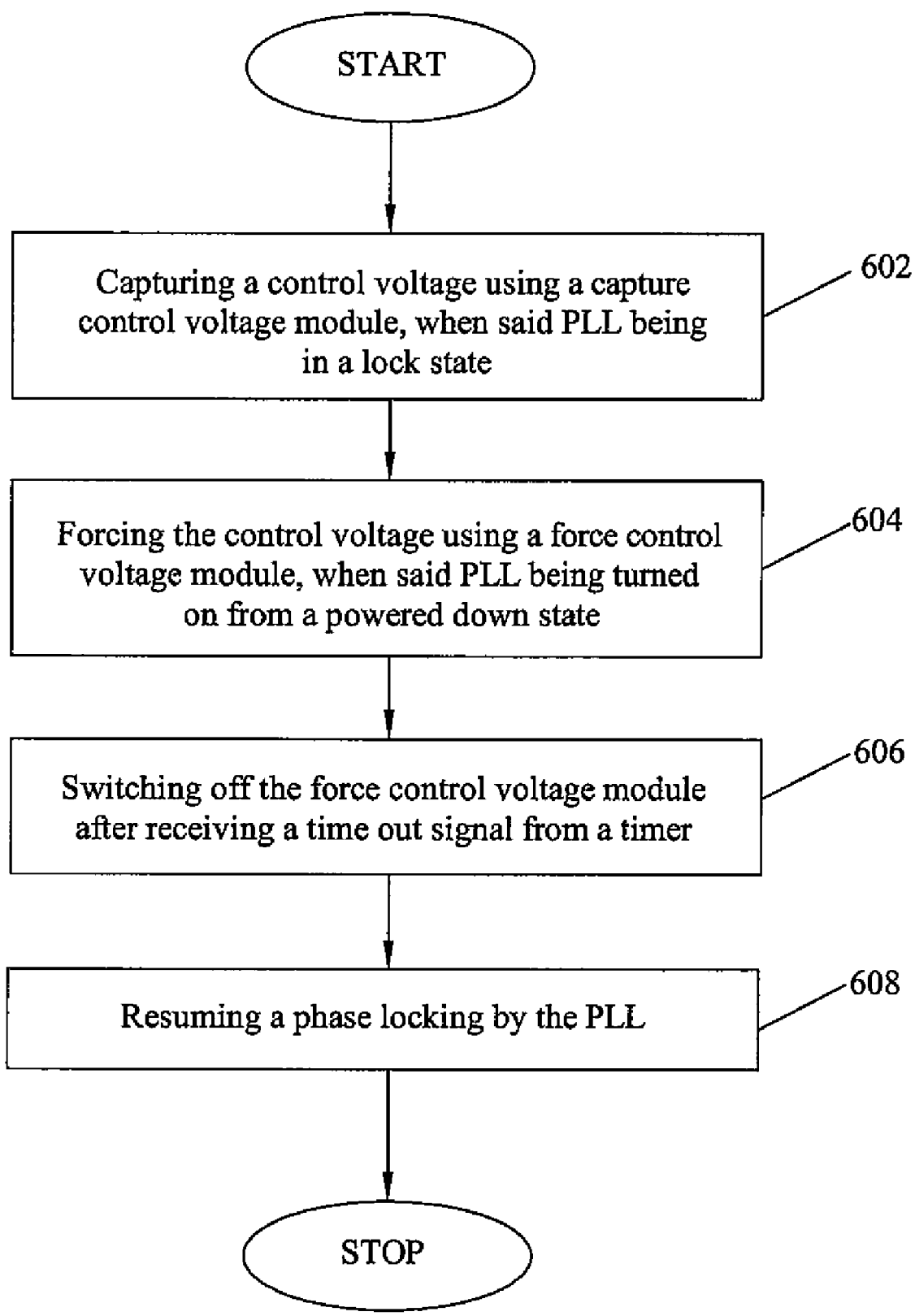
FIG. 6 illustrates a flow diagram of a method for reducing a re-lock time of a phase locked loop (PLL) according to another embodiment of the present disclosure.

FIG. 6 illustrates a flow diagram of a method for reducing a re-lock time of a phase locked loop (PLL) according to another embodiment of the present disclosure. At step 602, a control voltage is captured using the capture control voltage module when the PLL is in a lock state. At step 604, the control voltage is forced using a force control voltage module when the PLL is turned on from a powered down state. At step 606, the force control voltage module is switched off after receiving a time out signal from a timer. At step 608, a phase locking is resumed by the PLL.

The present disclosure provides a circuit for reducing a re-lock time of a phase locked loop (PLL) system offers various advantages. First, the present methodology has been implemented with simple digital structures for reducing the re-lock time of the phase locked loop systems. Second, the novel methodology is very cost effective as it utilizes simple comparators, resistors, and operational amplifiers for its operation.

Although the disclosure of circuit and method has been described in connection with the embodiments illustrated in the accompanying drawings, it is not limited thereto. It will be apparent to those skilled in the art that various substitutions, modifications and changes may be made thereto without departing from the scope and spirit of the disclosure.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, are incorporated herein by reference, in their entirety. Aspects of the embodiments can be modified, if necessary to employ concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

We claim:

1. A circuit for reducing a re-lock time of a phase locked loop (PLL) comprising:
   a pattern generator adapted to generate serialized data signals;
   a capture control voltage module using the serialized data signals for capturing a control voltage when said PLL is in a lock mode;
   a force control voltage module operatively coupled to said capture control voltage module for instantaneously passing a voltage from a node corresponding to said control voltage when the PLL is turned on from a powered off state;
   a plurality of serial resistances operatively coupled to the capture control voltage module and the force control voltage module, the plurality of serial resistances connected between a reference voltage and a ground voltage;
   a loop filter module operatively coupled to said force control voltage module for stabilizing and storing the control voltage; and
   a timer module operatively coupled to the force control voltage module for turning off said force control voltage module after a pre-defined number of input cycles.

2. The circuit as claimed in claim 1, wherein said loop filter comprises a low pass filter.

3. The circuit as claimed in claim 1, wherein said force control voltage module comprises an operation amplifier in a voltage follower mode.

4. A circuit for reducing a re-lock time of a phase locked loop (PLL) comprising:
   a capture control voltage module using parallel signals for capturing a control voltage when the PLL is in a lock mode;
   a force control voltage module operatively coupled to said capture control voltage module for instantaneously passing a voltage from a node corresponding to said control voltage when the PLL is turned on from a powered off state;
   a plurality of serial resistances operatively coupled to the capture control voltage module and the force control voltage module, the plurality of serial resistances connected between a reference voltage and a ground voltage;
   a loop filter module operatively coupled to said force control voltage module for stabilizing and storing the control voltage; and
   a timer module operatively coupled to the force control voltage module for turning off said force control voltage module after a pre-defined number of input cycles,
   wherein the capture control voltage module is adapted to compare the control voltage with voltages received from the plurality of serial resistances coupled between the reference voltage and the ground voltage during the lock time of the PLL and to store the voltage level closest to the control voltage.

5. The circuit as claimed in claim 4, wherein said loop filter comprises a low pass filter.

6. The circuit as claimed in claim 4, wherein said force control voltage module comprises an operational amplifier in a voltage follower mode.

7. A method for reducing a relock time of a phase locked loop (PLL) comprising:
   providing signal patterns to a capture control voltage module through a pattern generator;
   capturing a control voltage using the capture control voltage module when the PLL is in a lock state;

forcing the control voltage using a force control voltage module when the PLL is turned on from a powered down state;

switching off the force control voltage module after receiving a time out signal from a timer; and resuming a phase locking by the PLL.

8. The method of claim 7, comprising:

providing a plurality of series-coupled resistances coupled between a reference voltage and a ground voltage and further coupled to the voltage control circuit and to the force control voltage circuit to provide variable voltages thereto.

9. A circuit for use with a phase lock loop (PLL), comprising:

a pattern generator coupled to a voltage control circuit and adapted to generate a pattern of input voltages;

wherein the voltage control circuit is adapted to receive the pattern of input voltages and a control voltage, and to output a stored control voltage;

a force control voltage circuit coupled to the voltage control circuit to pass the stored control voltage to the voltage control circuit when the PLL is first powered up; and a plurality of series-coupled resistances coupled between a reference voltage and a ground voltage and further coupled to the voltage control circuit and to the force control voltage circuit to provide variable voltages thereto.

10. The circuit of claim 9, further comprising a loop filter circuit operatively coupled to the force control voltage circuit for stabilizing and storing the control voltage.

11. The circuit of claim 9, further comprising a timing circuit operatively coupled to the force control voltage circuit to turn off the force control voltage circuit after a pre-defined number of input voltage patterns are received.

12. The circuit of claim 9, wherein the force control voltage module comprises an operational amplifier having an input coupled to the plurality of series-coupled resistances and an output coupled to the loop filter circuit.

13. A system for reducing the relock time of a phase lock loop circuit, the system comprising:

a voltage pattern generator adapted to generate a pattern of input voltages for a capture control voltage circuit;

wherein the capture control voltage circuit is adapted to receive the pattern of input voltages, a control voltage, and to output a stored control voltage;

a force control voltage module coupled to the capture control voltage circuit and adapted to receive the stored control voltage and to force the stored control voltage when the PLL is first powered up;

a loop filter circuit coupled to the force control voltage circuit for stabilizing and storing the control voltage; and a timer circuit operatively coupled to the force control voltage circuit for turning off the force control voltage circuit after a predetermined number of input voltage cycles have been received.

14. The system of claim 13, wherein the capture control voltage circuit is adapted to compare the control voltage with voltages received from a plurality of series-coupled resistances coupled between a reference voltage and a ground voltage during the lock time of the PLL and to store the voltage level closest to the control voltage.

15. The system of claim 14, wherein the force control voltage module comprises an operational amplifier configured in voltage follower mode and having an input coupled to the plurality of series-coupled resistances and an output coupled to the loop filter circuit.

16. The system of claim 15, wherein the loop filter circuit comprises a low pass filter.

17. The system of claim 13, wherein the capture control voltage circuit is adapted to receive parallel patterns of input voltages.

18. A circuit for reducing a relock time of a phase locked loop (PLL), comprising:

a pattern generator adapted to generate serialized data signals;

a capture control voltage module using the serialized data signals for capturing a control voltage when said PLL is in a lock mode;

a force control voltage module coupled to the capture control voltage circuit and adapted to receive the stored control voltage and to force the stored control voltage when the PLL is first powered up;

a plurality of serial resistances operatively coupled to the capture control voltage module and the force control voltage module, the plurality of serial resistances connected between a reference voltage and a ground voltage.

19. The circuit of claim 18, further comprising:

a loop filter module operatively coupled to said force control voltage module for stabilizing and storing the control voltage.

20. The circuit of claim 19, further comprising:

a timer module operatively coupled to the force control voltage module for turning off said force control voltage module after a pre-defined number of input cycles.

21. A system for reducing the relock time of a phase lock loop circuit, the system comprising:

a capture control voltage circuit adapted to receive a pattern of input voltages, a control voltage, and to output a stored control voltage;

a force control voltage module coupled to the capture control voltage circuit and adapted to receive the stored control voltage and to force the stored control voltage when the PLL is first powered up;

a loop filter circuit coupled to the force control voltage circuit for stabilizing and storing the control voltage; and a timer circuit operatively coupled to the force control voltage circuit for turning off the force control voltage circuit after a predetermined number of input voltage cycles have been received, wherein the capture control voltage circuit is adapted to compare the control voltage with voltages received from a plurality of series-coupled resistances coupled between a reference voltage and a ground voltage during the lock time of the PLL and to store the voltage level closest to the control voltage.

22. The system of claim 21, wherein the force control voltage module comprises an operational amplifier configured in voltage follower mode and having an input coupled to the plurality of series-coupled resistances and an output coupled to the loop filter circuit.

23. The system of claim 22, wherein the loop filter circuit comprises a low pass filter.

24. The system of claim 21, wherein the capture control voltage circuit is adapted to receive parallel patterns of input voltages.

* * * * *